US 6,565,496 B1

(12) United States Patent
LaPlante et al.

(10) Patent No.: US 6,565,496 B1
(45) Date of Patent: May 20, 2003

(54) FULLY AUTOMATED PRECISION PUNCH HEAD LOADER FOR UNIVERSAL GANG-PUNCH TOOL

(75) Inventors: Mark J. LaPlante, Montgomery, NY (US); David C. Long, Wappingers Falls, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/045,831

(22) Filed: Jan. 11, 2002

(51) Int. Cl.[7] ............................................. B23Q 3/155
(52) U.S. Cl. ................... 483/1; 483/29; 83/549
(58) Field of Search ........................ 483/1, 28–29; 83/549

(56) References Cited

U.S. PATENT DOCUMENTS

| 4,555,966 | A | * | 12/1985 | Klingel ...................... 83/549 |
| 5,970,836 | A | * | 10/1999 | Sorel et al. ................ 483/29 |
| 6,133,540 | A | | 10/2000 | Weiss et al. |
| 6,135,933 | A | * | 10/2000 | Kelly et al. ................ 483/28 |
| 6,223,636 | B1 | | 5/2001 | LaPlante et al. |

FOREIGN PATENT DOCUMENTS

| JP | 7-80740 A | * | 3/1995 |
| JP | 7-290333 A | * | 11/1995 |

* cited by examiner

Primary Examiner—A. L. Wellington
Assistant Examiner—Erica E. Cadugan
(74) Attorney, Agent, or Firm—DeLio & Peterson, LLC; John J. Tomaszewski; Ira D. Blecker (57) ABSTRACT

An apparatus and method are provided for loading punch pins into a punch pin holding plate of a gang-punch apparatus wherein an individual punch pin is removed from a preloaded punch pin holder or supply plate, transferred to a load station which precisely locates the punch pin shank over the pre-drilled hole in the punch pin holding plate while holding the punch perpendicular and coaxial to the hole and pushes the punch into the punch pin holding plate. A vision system is used to align the hole in the punch pin holding plate and to verify that the punch pin is properly loaded into the holding plate. The above sequence for individual punches is repeated until the desired number of punch pins are transferred from the preloaded holder to the punch pin holding plate.

10 Claims, 11 Drawing Sheets

FULLY AUTOMATED PRECISION PUNCH HEAD LOADER FOR UNIVERSAL GANG-PUNCH TOOL

BACKGROUND OF THE INVENTION

1. Field of the Invention

This invention relates to the punching of holes in thin sheet materials such as greensheets used in the manufacture of integrated circuit semiconductor package structures and, more particularly, to a method and apparatus for loading punch pins into a gang-punch apparatus which apparatus is used to form holes in a desired pattern in the greensheet thin sheet material.

2. Description of Related Art

In the manufacture of multilayer ceramic (MLC) substrates for integrated circuit semiconductor package structures, a plurality of green ceramic sheets (commonly termed greensheets) are formed by doctor blading a slurry containing a resin binder, a particulate ceramic material, solvents and a plasticizer, drying the doctor bladed sheet and cutting it into appropriate size sheets. Holes, commonly termed vias, are then punched in each of the greensheets in desired circuitry patterns to facilitate forming electrical interconnections through the sheet. Electrically conductive paste is deposited in the holes and in appropriate circuitry patterns on the surface of the greensheets, each of the patterned sheets stacked and laminated, and the assembly subsequently fired at a sintering temperature to form a MLC substrate.

The vias are formed in the ceramic material when the material is in its green state. Prior to being fired, the greensheets are easily deformed and the precision with which the via holes are formed is greatly dependent upon the use of apparatus which minimize distortion or disruption to the structural integrity of the greensheet other than forming the via hole. With the size of electrical components constantly being reduced through technical improvement the positioning of the via holes in the ceramic greensheets is becoming ever more restrictive. Further, with the increase in the quantity of the electronic circuits needed to make the electronic component package, the requirement for a larger number of vias per unit area of substrate is evident.

Large numbers of holes must be punched into a greensheet with a high degree of precision in order to properly position the holes. At the same time, this punching operation must occur very rapidly in order to produce the large numbers of greensheets that are necessary in the mass production of multilayer ceramic electronic components.

One method for punching greensheets is using a gang-punch apparatus. A gang-punch is a punch/die set where all the punches for a particular ceramic greensheet layer are mounted in a rigid plate. The gang-punch is used to punch the entire greensheet (layer) with a single stroke. A gang-punch has very high throughput and is cost effective for very high volume products. Typically a separate gang-punch is used to punch each layer of the MLC package.

A number of attempts have been made to provide a universal "gang-punch" apparatus which will economically and efficiently provide the means to make via openings in each of the different greensheets used to make the MLC product. One type apparatus utilizes an interposer mask which contains hole openings where holes are desired to be punched. In these type apparatus, a plurality of punch elements are arranged in a grid arranged over the greensheet which is covered by the interposer mask. The greensheet is positioned on a die having through openings corresponding to all the punch elements in the punch head. When the punch elements contact the interposer mask as the punch head is moved downwardly, the hole will be punched where the openings occur since the punch element would pass through the openings in the interposer mask and through the ceramic greensheet. In other areas covered by the interposer mask, i.e., where holes are not desired, the interposer mask will stop the punch element and be retracted into the punch head. A progressive gang-punch utilizes steel balls at locations of punches to be punched on the surface of the punch head which when a roller traverses the top of the punch head vias are punched only where steel balls are located.

A particularly desirable low-cost high-density gang-punch is shown in U.S. Pat. No. 6,223,636 assigned to the assignee of the present invention. The disclosure of this patent is hereby incorporated by reference. In this patent, a gang-punch apparatus is provided for punching selected hole patterns in greensheets. The gang-punch apparatus uses a program plate in a punch head which holds punch pins and which program plate is positioned intermediate the non-punching end of the punch pins and a clearance plate wherein punch pins not used for punching a layer of a particular greensheet are retracted during punching. At the other punch pin locations, the punch pins upon activation of the punch apparatus are extended through the lower portion of the punch apparatus through a greensheet and die to form vias in the greensheet. A preferred punch pin used in the gang-punch apparatus comprises an elongated shank or stem having a ball at its upper end and an opposed squarely cut-off lower end. The diameter of the ball is slightly larger than the diameter of the stem and is supported by the upper surface of a guide plate in the gang-punch apparatus to hold the punch pins. The punch pin may be made from any suitable material such as tungsten, tungsten alloy, steel, beryllium, titanium and is preferably a tungsten carbide material.

In general, the gang-punch tools of the prior art, and in particular, the punch tool disclosed in U.S. Pat. No. 6,223,636, utilizes a punch head composed of thin plates loaded with many thousands of precision tungsten carbide punch pins. The typical punch head holds in excess of 40,000 individual punches that must be loaded into the drilled holes in the punch head plates. Due to the high number of punches used and their fragile nature and small size and close fit into the holes in the punch head, it is important that a precision automated device be provided to load each punch pin into the punch head with little or no intervention from an operator.

Bearing in mind the problems and deficiencies of the prior art, it is therefore an object of the present invention to provide an apparatus for loading punch pins into a punch apparatus such as a gang-punch apparatus used for punching vias in greensheets.

It is another object of the present invention to provide a method for loading punch pins into a punch apparatus such as a gang-punch apparatus for punching vias in greensheets.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an apparatus for loading punch pins into a punch apparatus, i.e., a gang-punch, wherein the punch pins have an elongated shank of a first diameter and a larger spherical, cylindrical or other type head having a second larger diameter which punch pins are positioned vertically in a grid in a punch pin supply plate. The punch pins are transferred preferably one at a time to a punch pin receiver device which is positioned above the surface of a movable jaw with the lower end of the receiver device proximate the surface of the jaw. The jaw, together with a mating jaw, are then positioned over an opening to be filled in a punch pin holding plate of the gang-punch apparatus. The receiver device is moved over the jaw opening and the punch pin in the device is forced into the punch pin holding plate opening. The above steps are repeated until the desired number of punch pins are transferred to the gang-punch punch pin holding plate.

In another aspect of the invention, a preferred apparatus for loading punch pins into a gang-punch apparatus comprises:

a punch pin supply plate containing a plurality of openings in a grid in which a plurality of punch pins are positioned vertically, the punch pins having an elongated shank of a first diameter and a second larger diameter head which head rests on or is slightly above the upper surface of the supply plate;

a punch pin removal device for removing preferably a single punch pin from the supply plate into the punch pin removal device;

a left jaw and a right jaw each movable horizontally and each having an upper surface and a lower surface and a mating opening at each end thereof for receiving and holding a punch pin vertically;

a punch pin receiver device having an open upper end and an open lower end for receiving the removed punch pin from the punch pin removal device in a vertical orientation with the head upward, the lower end of the punch pin receiver device being positioned proximate the upper surface of the left jaw;

preferably a transfer conduit for transferring the punch pin from the removal device to the punch pin receiver device;

a punch pin blow down device for exerting a force on the punch pin in the punch pin receiver device;

a punch pin pusher device for exerting a force on the head of the punch pin; and an X-Y table on which a gang-punch pin holding plate having a plurality of openings is secured thereto for positioning the gang-punch punch pin holding plate;

wherein a punch pin removed from the supply plate by the punch pin removal device is transferred to the punch pin receiver device, the left jaw and right jaw are mated and positioned over the gang-punch punch pin holding plate opening to be filled and the punch pin receiver moved over the opening and the punch pin blow down device forces the punch pin from the punch pin receiver into the opening in the jaws, the punch pin receiver and punch pin blow down devices are then moved away and the punch pin pusher device used to exert a force on the head of the punch pin forcing the punch pin partly into the gang-punch punch pin holding plate opening, the jaws are then moved away and the punch pin pusher device used to exert a force on the head of the punch pin forcing the punch pin into the gang-punch punch pin holding plate opening with the above steps being repeated until the desired number of punch pins are transferred from the punch pin supply plate to the gang-punch punch pin holding plate.

In an additional aspect of the invention, a method for loading punch pins into a gang-punch apparatus comprises the steps of:

supplying a gang-punch punch pin holding plate having a plurality of openings to be filled with punch pins, the punch pins having an elongated shank of a first diameter and a second larger diameter head which head is slightly above or supported by the upper surface of the holding plate;

positioning the gang-punch punch pin holding plate into a gang-punch punch pin loading apparatus described above;

removing a punch pin from the punch pin supply plate with the punch pin removal device;

transferring the punch pin into the punch pin receiver device;

moving the left and right jaws over the opening in the gang-punch punch pin holding plate to be filled;

moving the punch pin receiver device over the jaw opening;

forcing the punch pin from the receiver device into the jaw opening using the punch pin blow down device;

moving the punch pin receiver device and punch pin blow down device away from the opening in the gang-punch punch pin holding plate;

forcing the punch pin partly into the gang-punch punch pin holding plate using the punch pin pusher device to exert a force on the head of the punch pin;

moving the jaws away from the opening and forcing the punch pin into the gang-punch punch pin holding plate using the punch pin pusher device; and repeating the above steps until the desired number of punch pins are transferred from the punch pin supply plate to the gang-punch punch pin holding plate.

The method and apparatus for loading punch pins into a gang punch as described above are preferably used with the low-cost high-density gang-punch described in U.S. Pat. No. 6,223,636, supra. The guide plate of the gang-punch of the patent (also termed herein gang-punch punch pin holding plate) would be filled with the punch pins and the guide plate then used in the gang-punch apparatus described in the patent. The punch pins have an elongated shank of a first diameter and a second diameter larger head and are axially slideably disposed in the vertical through holes of the guide plate and the head keeps the punch pin from falling through the openings in the guide plate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1A–6C of the drawings in which like numerals refer to like features of the invention. Features of the invention are not necessarily shown to scale in the drawings.

Figure 3A:
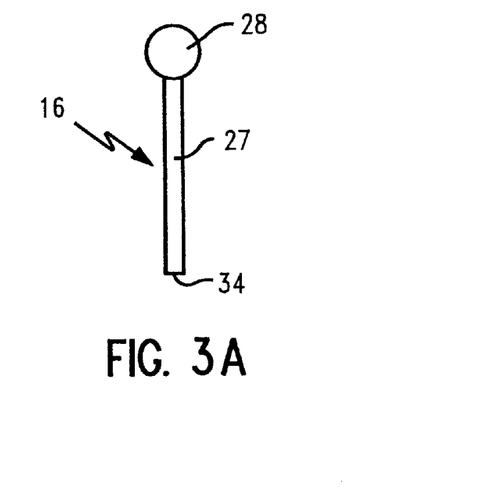
FIGS. 3A and 3B show punch pins used in the method and apparatus of the invention.
Figure 3B:
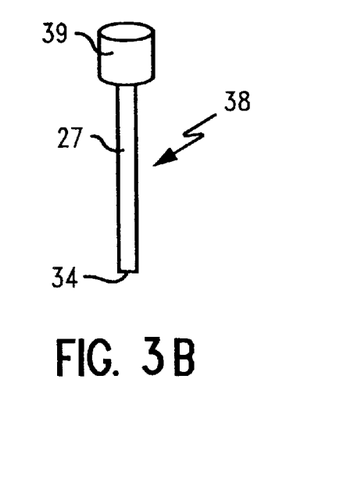

Referring first to FIGS. 3A and 3B, punch pins which may be used in the method and apparatus of the invention are shown. The punch pin 16 in FIG. 3A comprises an elongated shank or stem 27 having a ball (head) 28 at one end thereof and an opposed squarely cut-off end 34. The punch pin 38 in FIG. 3B has a larger cylindrical head 39. The diameter of the head 28 and 39 is slightly larger than the diameter of the stem, typically about 0.002 inch larger. The stem is typically 0.003 inch –0.008 inch in diameter but may be smaller or larger for certain applications. It is preferred that the stem be about 0.025 inch –0.250 inch, preferably about 0.100 inch long. The head 28 and 39 is used to keep the punch pin from falling through the opening in the punch pin holding plate used in the gang-punch apparatus. The punch pin may be made from any suitable material such as tungsten, tungsten alloys, steel, beryllium, titanium, etc., preferably tungsten carbide.

Figure 2:
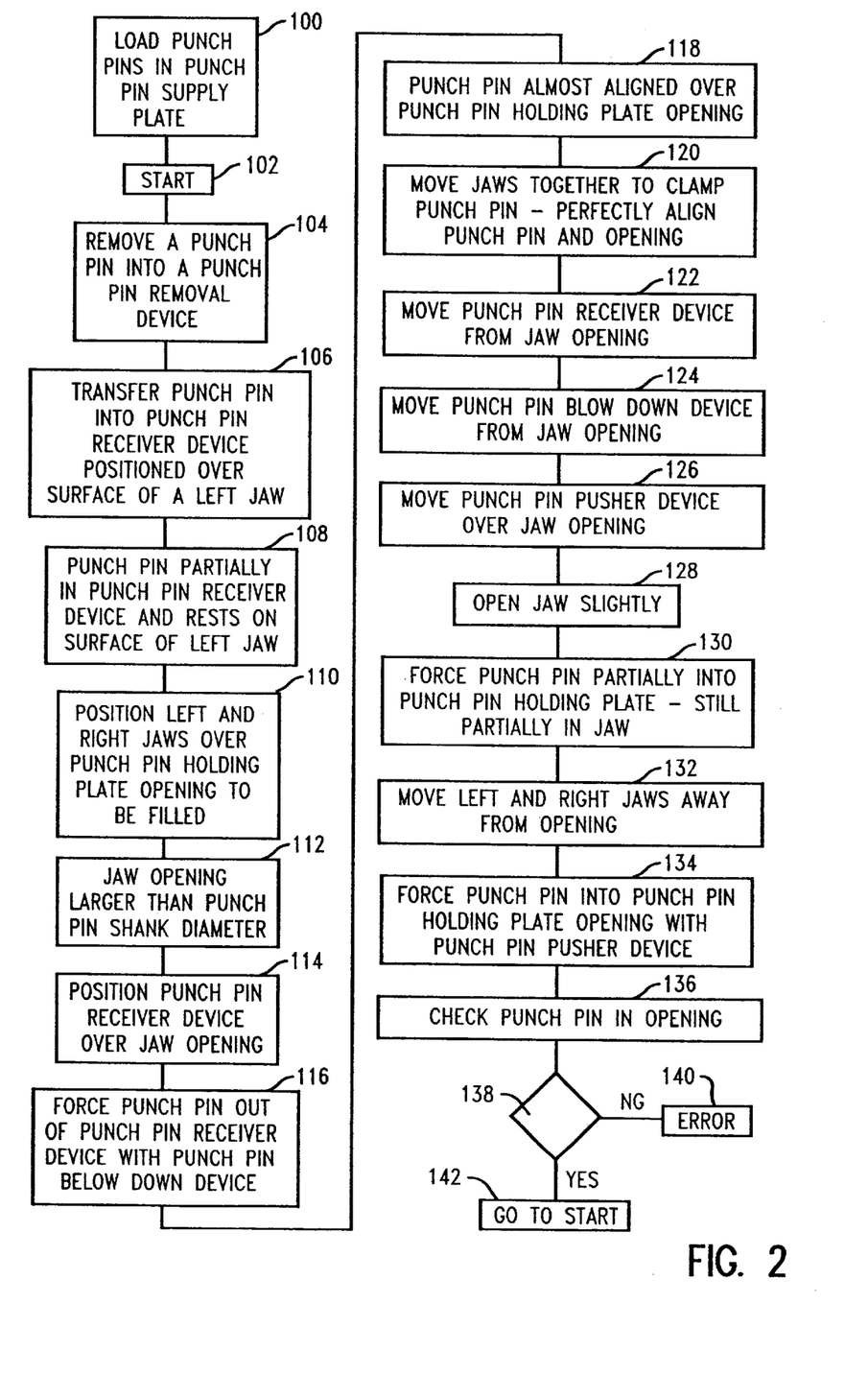
FIG. 2 is a flow chart of the method of the invention.

Referring now to FIG. 2, the method and apparatus of the invention may be described. In step 100, the punch pins to be transferred to a gang-punch apparatus are loaded in a punch pin supply plate. The supply plate will typically be about 4 inch square and about 0.003 inch thick and can be made of any suitable material such as photoetched molybdenum. A plurality of holes such as 10,000 are formed in the plate in a grid (preferably X-Y) and have a diameter larger than the shank diameter of the punch pin but less than the head diameter typically about 0.005 inch. The punch pin used in the preferred aspects of the invention will have a shank diameter of about 0.004 inch, a spherical head of about 0.006 inch diameter and be about 0.110 inch long. Conventional photoetching procedures can be used to form the holes in the supply plate.

In steps 102 (start) and 104 a punch pin is removed from the supply plate into a punch pin removal device. In step 106 the punch pin is transferred from the removal device into a punch pin receiver device which lower end is positioned over the upper surface and proximate to the upper surface of a left aligning jaw. In this position, as shown in step 108, the punch pin is partially in the punch pin receiver and the lower end of the pin partially extends from the lower end of the receiver and rests on the upper surface of the left jaw.

In step 110, the left and right aligning jaws are positioned over the gang-punch punch pin holding plate opening to be filled. The punch pin holding plate is attached to an X-Y platform for positioning. In this position, in step 112, the jaw opening is approximately 0.004 inch plus 0.0005 inch which is greater than the diameter of the shank of the punch pin but less than the diameter of the head. In step 114 the punch pin receiver device is positioned over the jaw opening and in step 116 the punch pin is forced into the jaw opening completely out of the punch pin receiver using a punch pin blow down device.

In step 118 the punch pin is almost aligned over the punch pin plate opening and in step 120 the jaws are moved together lightly clamping the punch pin shank in perfect axial alignment between the punch pin and punch pin holding plate opening.

In step 122 the punch pin receiver device is moved away from the jaw opening to the left over the upper surface of the left aligning jaw. The punch pin blow down device is moved in step 124 to the right away from the punch pin holding plate opening.

In step 126 the punch pin pusher device is moved over the jaw opening. The jaw is opened slightly in step 128 so that the jaw opening is about 0.004 inch plus 0.0001 inch, which is slightly larger than the shank diameter of the punch pin.

The punch pin pusher device in step 130 forces the punch pin partially into the punch pin holding plate opening with part of the punch pin remaining in the jaw. In step 132 the left and right jaws are moved away from the punch pusher device and in step 134 the punch pusher device forces the punch pin into the punch pin holding plate. In step 136 the punch pin is verified for positioning in the punch pin holding plate opening. If step 138 determines that the punch pin is not properly in the opening, this is an error condition (step 140) which must be corrected. If the punch pin is properly in the opening, step 142 returns the method to start step 102 and the method repeated until the desired number of punch pins are removed from the punch pin supply plate and transferred to the punch pin holding plate of the gang-punch apparatus.

Referring now to FIGS. 1A–1G, the method and apparatus of the invention can be demonstrated.

Figure 1A:
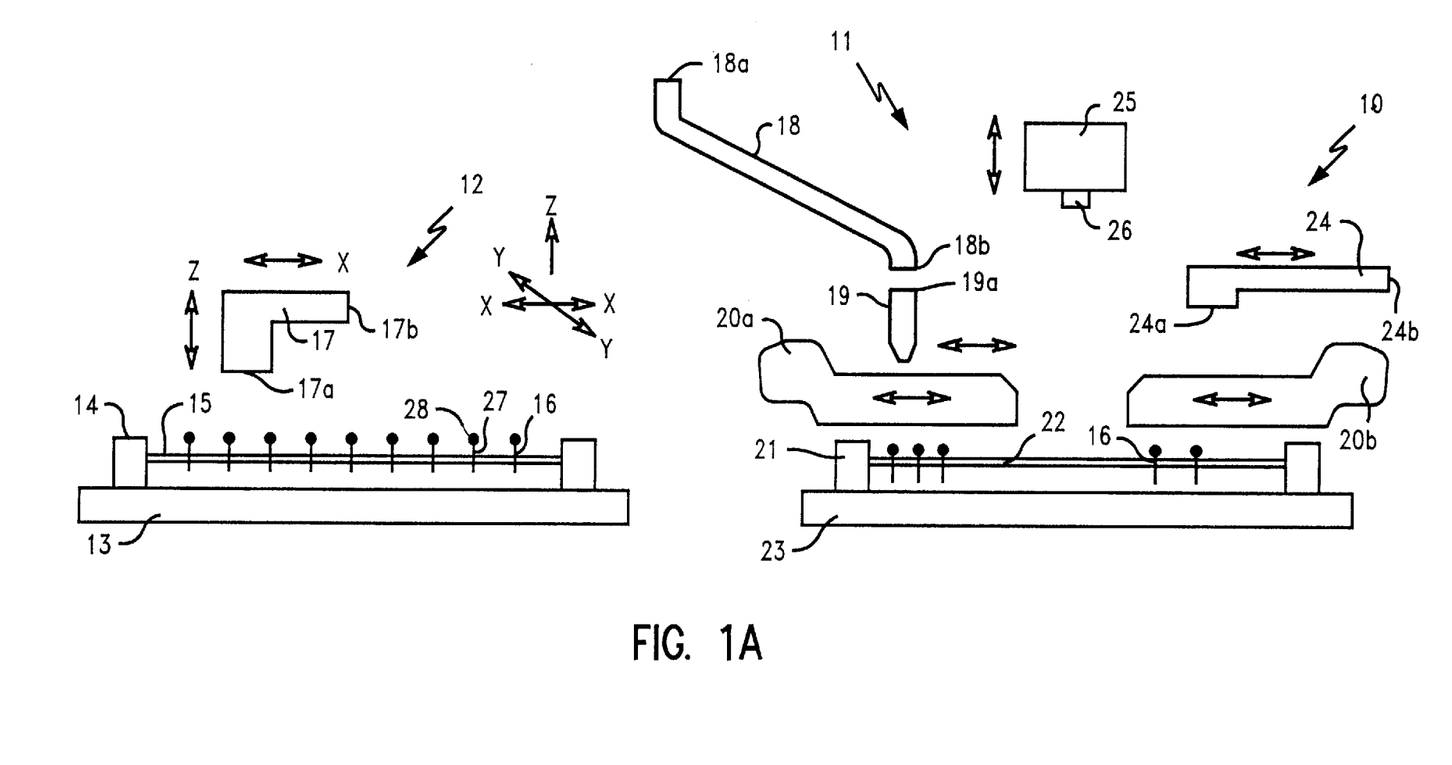
FIGS. 1A–1G show the gang-punch punch pin loading apparatus of the invention in schematic and the sequence of steps used to transfer punch pins from a supply plate to the punch pin holding plate used in the gang-punch apparatus to hold the punch pins.

In FIG. 1A the complete gang-punch punch pin loading apparatus including the punch pin supply apparatus is shown in schematic as numeral 10. The punch pin plate loading apparatus is shown generally as 11 and the supply punch pin plate unloading apparatus is shown generally as 12.

The supply punch plate pin apparatus 12 has a supply plate X-Y table 13 on which is positioned a supply plate carriage 14 holding a punch pin supply plate 15. The punch pin supply plate 15 has a number of punch pins 16 inserted vertically through the plate with the head of the pin 28 above the upper surface of the punch pin supply plate and the shank 27 of the punch pin extending through the supply plate. As discussed above, the supply plate 15 will typically contain a large number of punch pins such as 10,000 arranged in an X-Y grid. The punch pin head 28 preferably rests on the surface of supply plate 15.

Positioned above the punch pin supply plate 15 is an inverted L-shaped punch pin removal device shown as 17. The device has an open lower portion 17*a* and a side open portion 17*b*. The punch pin removal device preferably moves horizontally in an X plane and also vertically in a Z plane.

In the punch pin plate apparatus 11, a punch pin delivery tube 18 is shown with the lower open end 18*b* proximate the upper opening 19a of a punch pin receiver device 19. The punch pin receiver device 19 is shown moving in an X plane. A left jaw 20a and a right jaw 20b are shown positioned above the height of punch pins 16 which are already filled in some of the openings in punch pin holding plate 22. The left jaw 20a and right jaw 20b move horizontally in an X plane. The punch pin holding plate 22 is supported by carriage 21 which carriage is supported on a punch pin plate X-Y table which moves in an X-Y plane.

A punch pin blow down device 24 is shown positioned over right jaw 20b and has a lower opening 24a and another side opening at end 24b. The punch pin blow down device moves in an X plane. Positioned centrally over the apparatus 11 is a punch pin pusher device 25 which has a pusher piston rod 26 associated therewith. The punch pin pusher device 25 moves in a Z direction. The punch pin pusher device may also have incorporated therein a video verification device to determine if a punch pin is properly transferred to the opening in the punch pin holding plate 22. A separate video verification device may be used but, for convenience, it is shown as incorporated in the punch pin pusher device.

Referring to FIG. 2, FIG. 1A represents the gang-punch apparatus at the start of the punch pin loading operation, step 102.

Figure 1B:
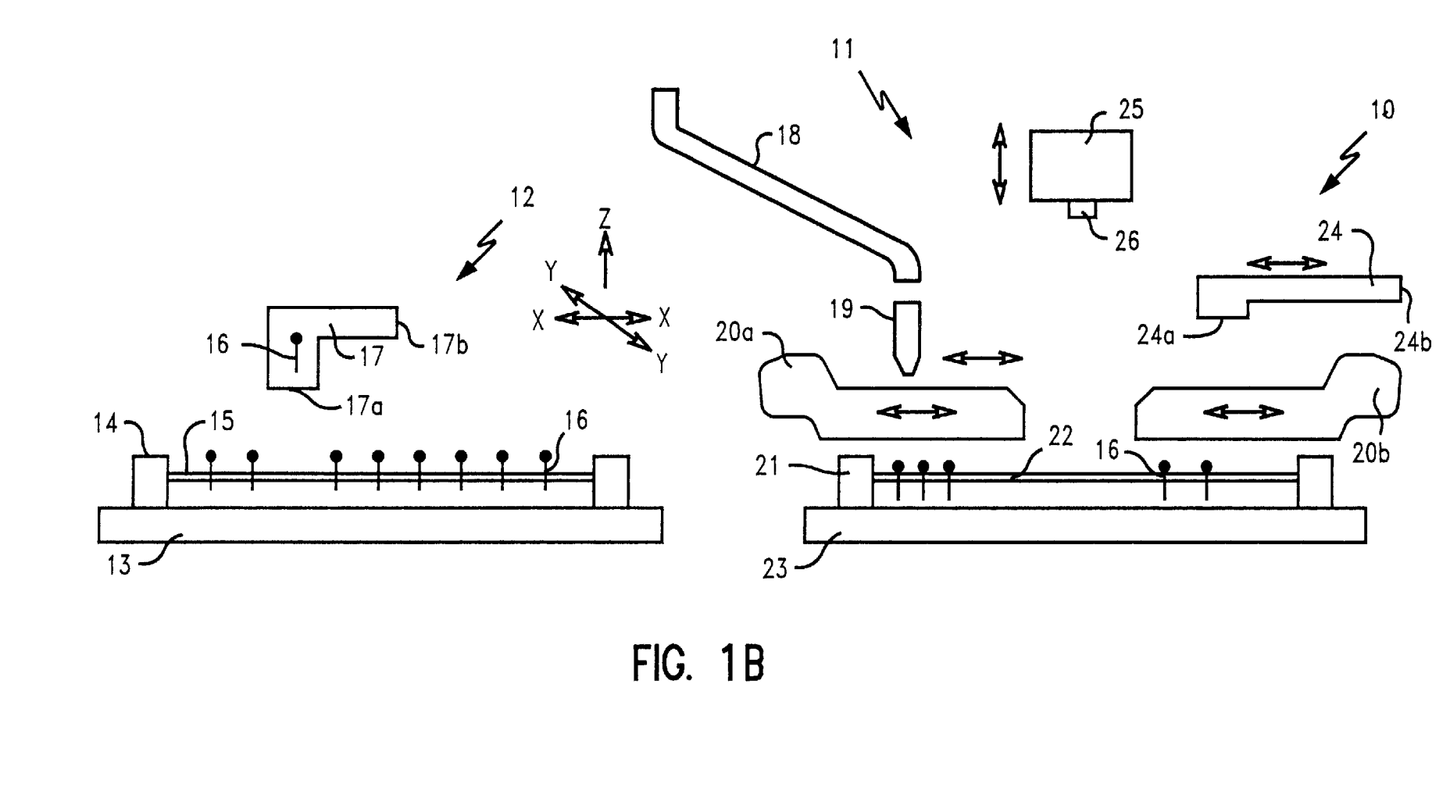
Figure 4A:
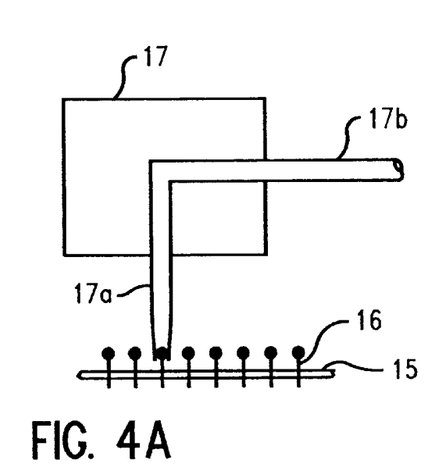
FIGS. 4A and 4B show, respectively, a punch pin removal device for removing a single punch pin from the punch pin supply plate and transfer of the removed punch pin to a punch pin receiver device.
Figure 4B:
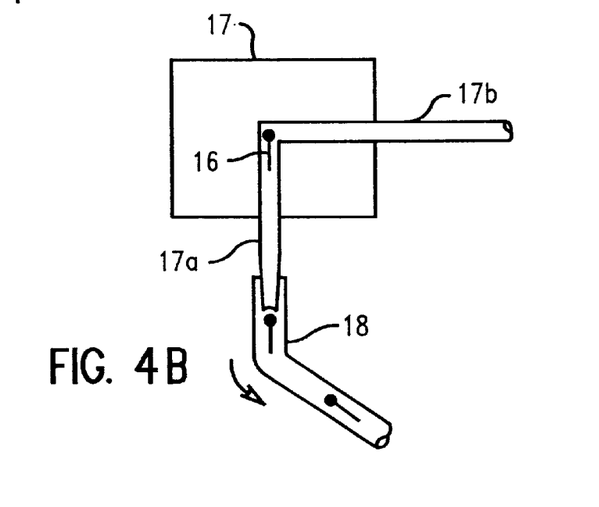

Referring now to FIG. 1B, it can be seen that the punch pin removal device 17 has been positioned over the supply plate 15 and has removed a punch pin 16 from the supply plate 15 into the device. The punch pin is received into the removal device through opening 17a typically by a vacuum applied to opening 17b. The punch pin 16 is oriented vertically in a vertical leg of removal device 17. Details of the removal device are shown in FIGS. 4A and 4B.

Figure 1C:
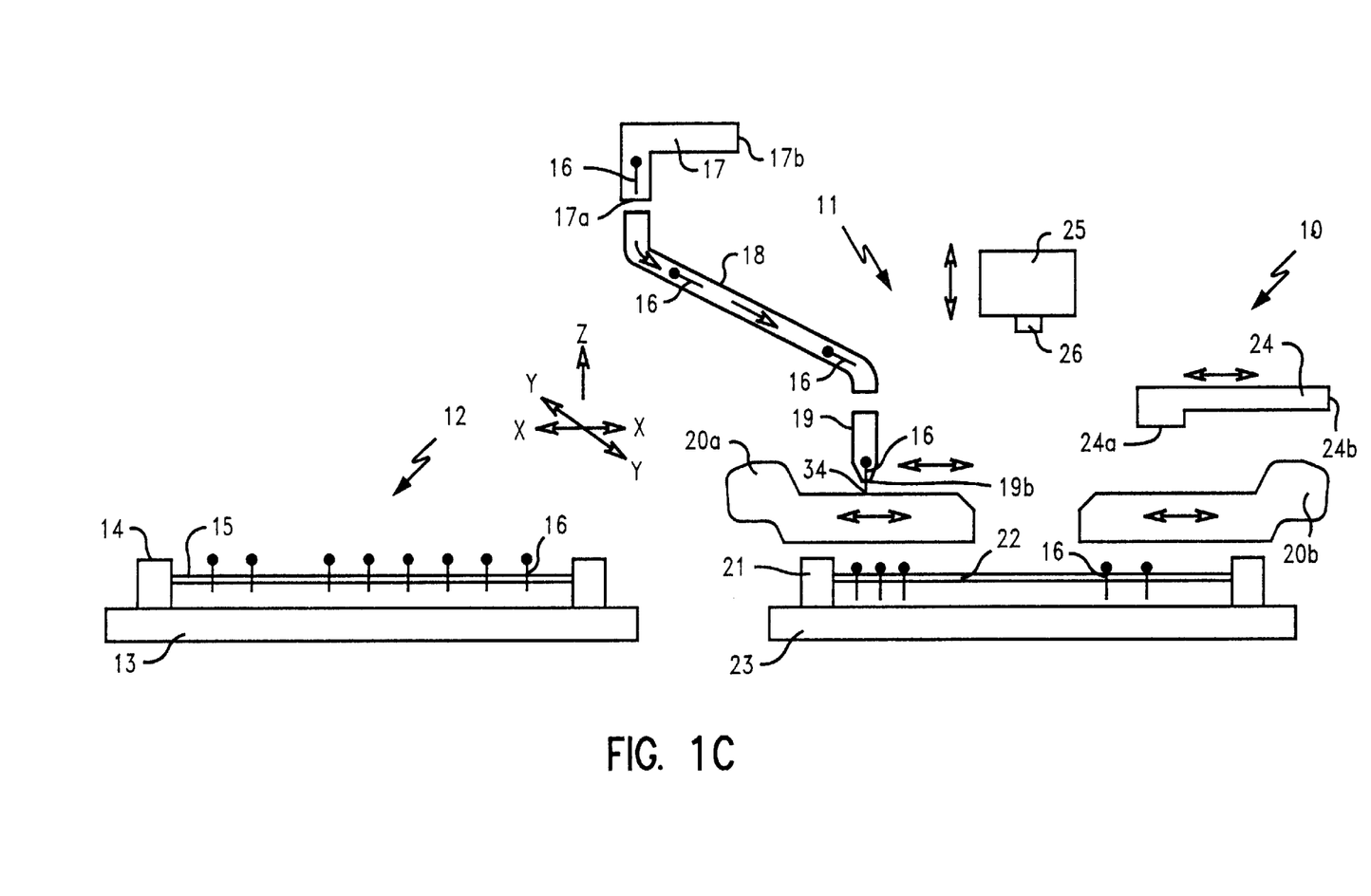

In FIG. 1C the opening 17a of punch pin removal device 17 is positioned over opening 18a of delivery tube 18. The punch pin 16 is shown moving downward from the punch pin removal device 17 into delivery tube 18 and into punch pin receiver device 19. Compressed air can be used to force the punch pin 16 out of removal device 17 through opening 17b. When the punch pin is in punch pin receiver device 19, the lower end 34 of the punch pin 16 is resting on the upper surface of left jaw 20a and the lower part 19b of punch pin receiver 19 is slightly above the upper surface of left jaw 20a. It can be seen from FIG. 1C that some punch pins 16 have already been transferred to punch pin holding plate 22 and that this step of the method will be to transfer another punch pin 16 into the punch pin holding plate 22.

Figure 1D:
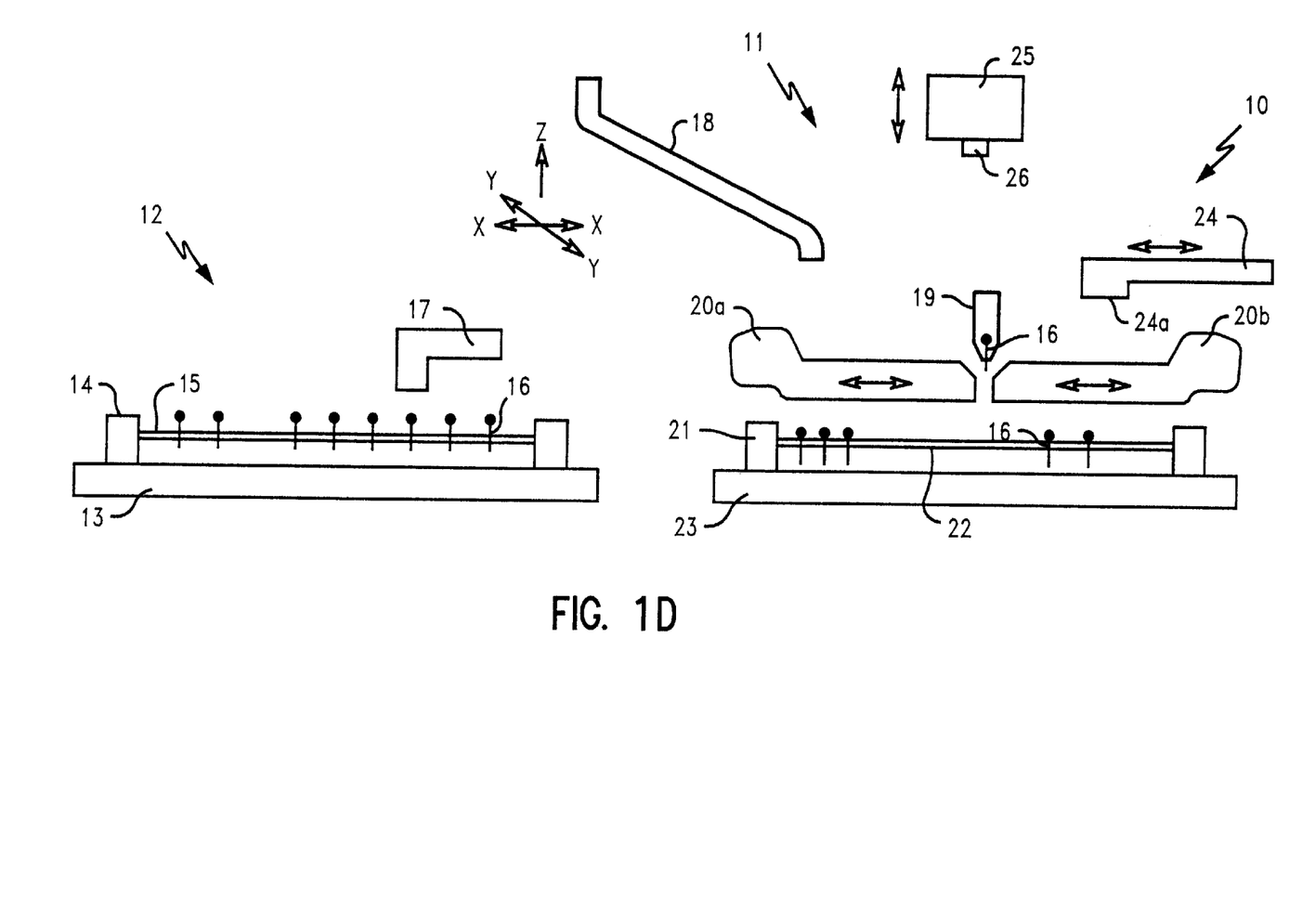

Referring now to FIG. 1D, the punch pin removal device 17 has been moved back over the upper surface of punch pin supply plate 15 and is ready for receiving another punch pin 16. Jaws 20a and 20b have been moved together over the desired opening to be filled in the punch pin holding plate 22 and the punch pin receiver 19 has been moved over the opening in the jaws. It can be seen that the punch pin 16 is partially in the receiver and partially in the jaws and is held in the receiver due to the jaw opening being only slightly wider than the punch pin shank diameter.

Figure 1E:
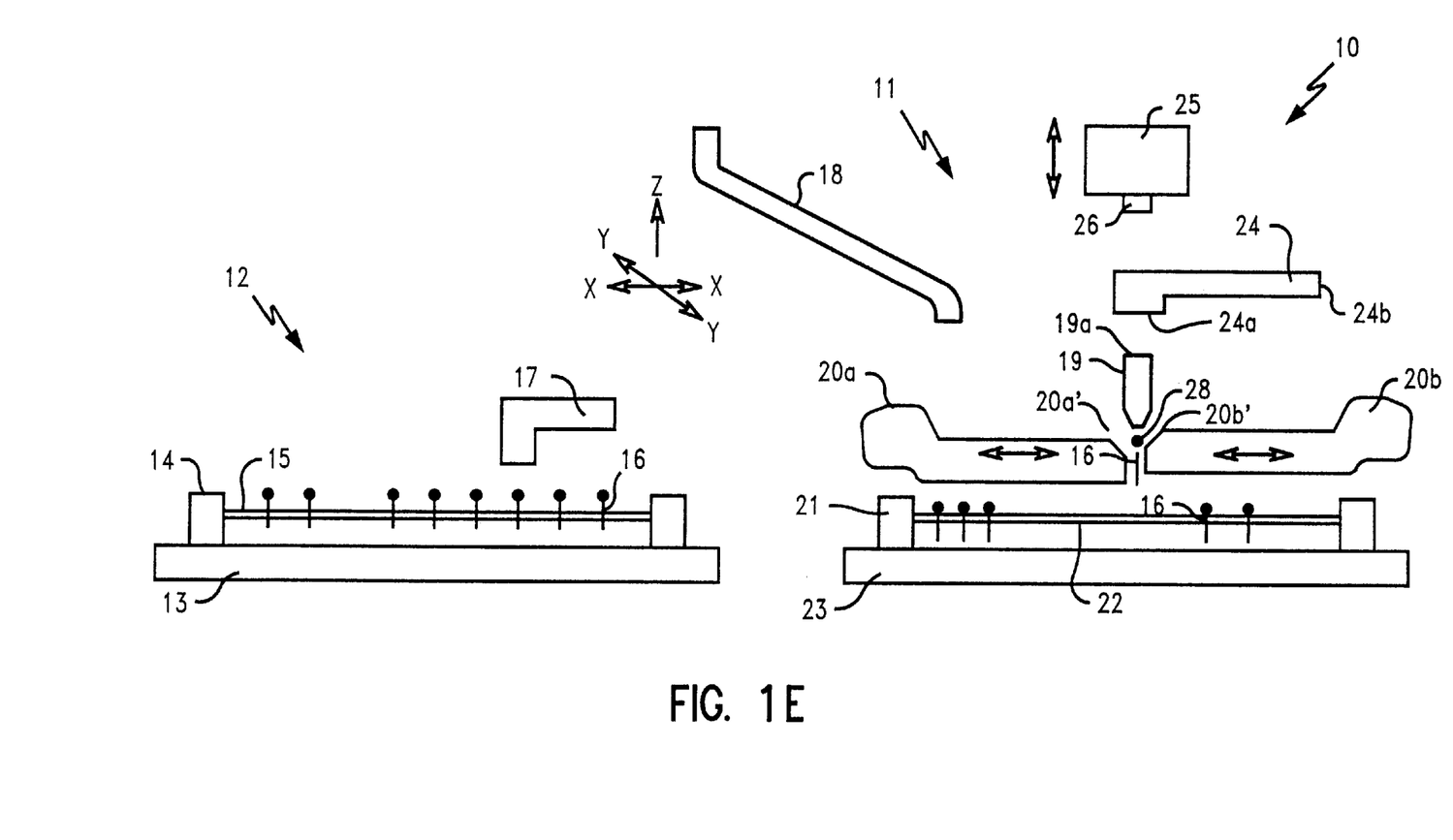

At this point, as shown in FIG. 1E, the punch pin blow down device 24 is moved over the punch pin receiver 19 so that the opening 24a of the blow down device is opposite the opening 19a of the receiver 19. Compressed air or other means supplied through opening 24b is used to force the punch pin 16 out of the receiver device 19 into the opening of the jaws 20a and 20b. The punch pin 16 is now completely out of the receiver 19 and the head 28 of the punch pin 16 resting at the bottom of the taper 20a' and 20b'.

Figure 1F:
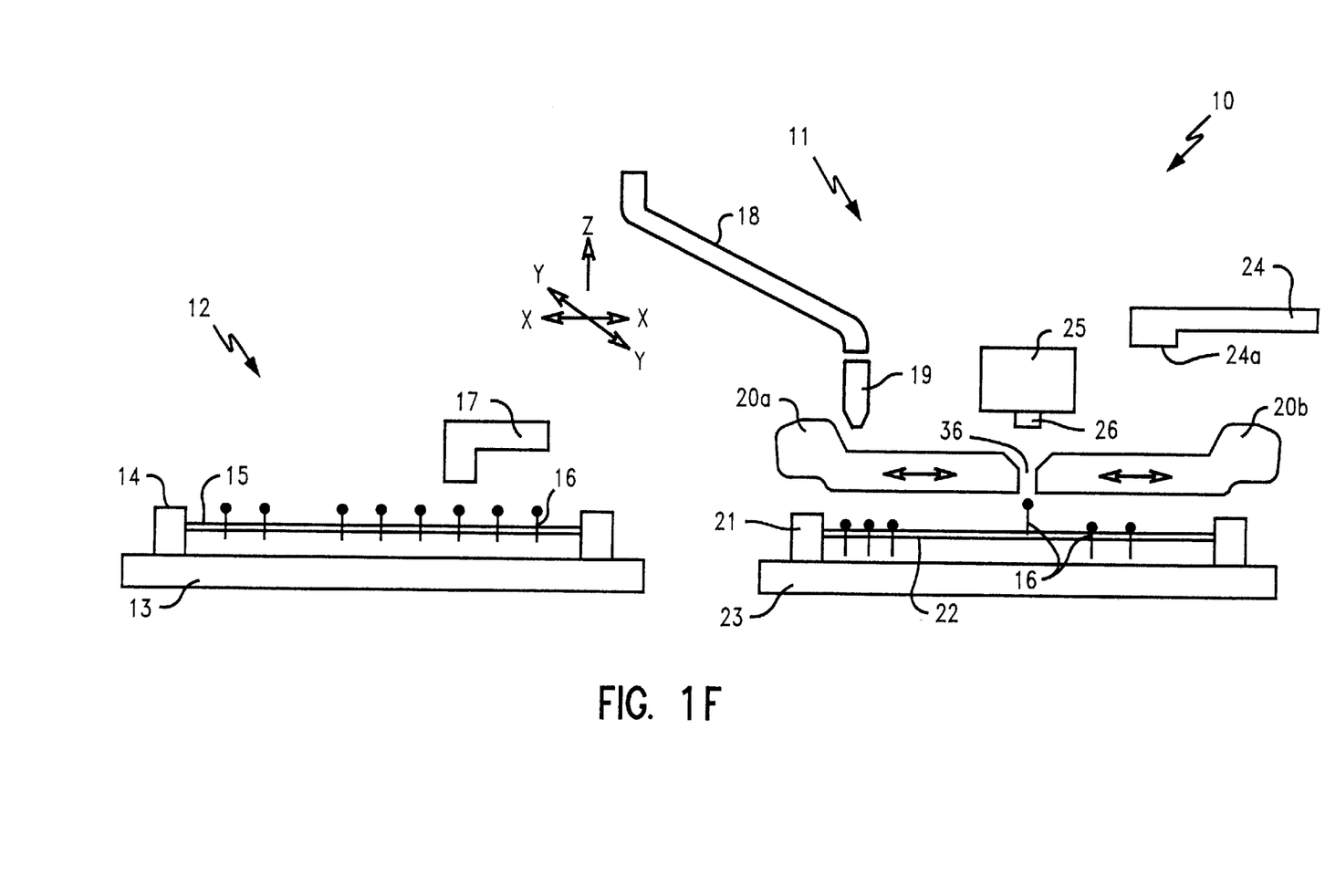
Figure 1G:
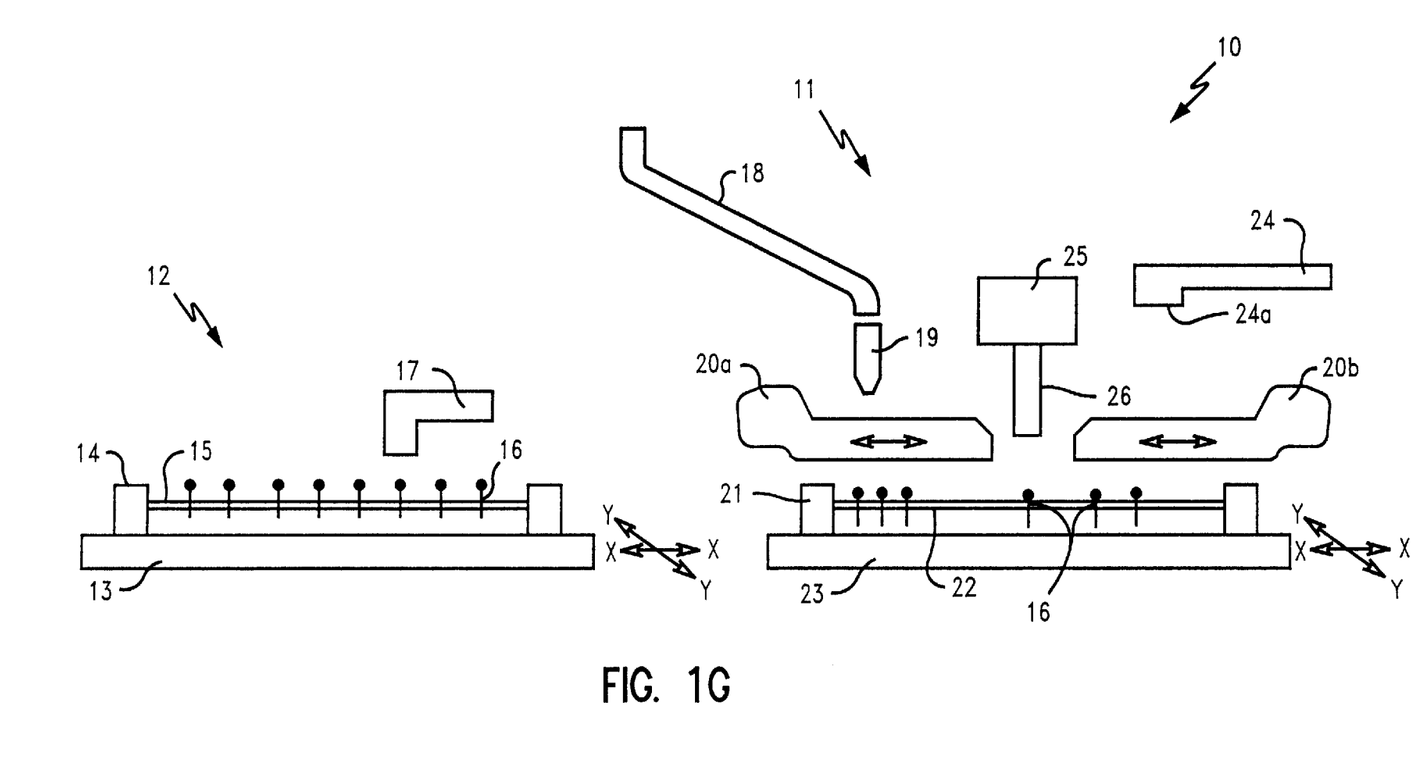

In FIG. 1F the punch pin blow down device 24 is moved to the right away from the opening and receiver device 19 is moved to the left away from the opening to be filled. The jaw opening is opened slightly and punch pin pusher device 25 is lowered toward the opening and in position for pusher piston rod 26 to push punch pin 16 partly into punch pin holding plate 22 so that it is partially in punch pin holding plate 22 and partially in the opening 36 between jaws 20a and 20b. In FIG. 1G jaws 20a and 20b are moved away from the opening and the pusher piston rod 26 extended to force the punch pin 16 completely into punch pin holding plate 22. The piston rod may be associated with a spring to facilitate retraction of the piston rod 26.

The apparatus is now in position for receiving another punch pin 16 from supply plate 15 as shown in FIG. 1A and the steps shown in FIGS. 1A–1G repeated until all the desired punch pins are transferred.

Referring to FIG. 4A, the punch pin removal device 17 is shown in detail as comprising a vertical open ended tube 17a and a connecting open ended horizontal tube 17b contained within the device. The opening of vertical tube 17a is shown positioned over a punch pin 16 vertically positioned in supply plate 15. A vacuum would be applied to the opening in horizontal tube 17b and the punch pin removed from supply plate 15 into vertical tube 17a as shown in FIG. 4B. Punch pin 16 is positioned vertically at the juncture of vertical tube 17a and horizontal tube 17b. Vertical tube 17a is positioned in delivery tube 18. Compressed air or other force applied to horizontal tube 17b will force punch pin 16 from vertical tube 17a downward into delivery tube 18 for delivery of the punch pin 16 to punch pin receiver device 19 as described hereinabove. The punch pin 16 may also be transferred directly from removal device 17 to receiver device 19.

Figure 5A:
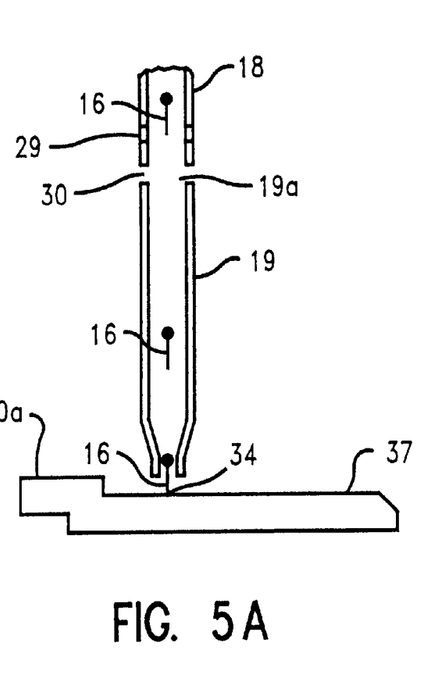
FIGS. 5A and 5B show, respectively, a punch pin receiver device for receiving a punch pin from the punch pin removal device and the positioning of the punch pin receiver device over a jaw of the apparatus and the punch pin receiver positioned over an opening to be filled with a punch pin blow down device communicating with the punch pin removal device for forcing the punch pin from the receiving device into the mated jaws used to hold the punch pin before insertion into the punch pin holding plate opening.

Referring now to FIG. 5A, a detailed view of the punch pin receiver device 19 is shown positioned slightly above the upper surface 37 of left jaw 20a. The device 19 is tapered at its lower end and a single punch pin 16 is shown moving downward in the device 19 so that the lower end of the shank 34 finally rests on the upper surface 37 of left jaw 20a. The delivery tube 18 is shown having a collar 29 at the end thereof which is positioned to align with the upper open portion 19a of device 19. An opening 30 is maintained between collar 29 and upper part 19a of device 19 to allow air to escape during forcing of the pin 16 out of the punch pin removal device 17 through transfer tube 18.

Figure 5B:
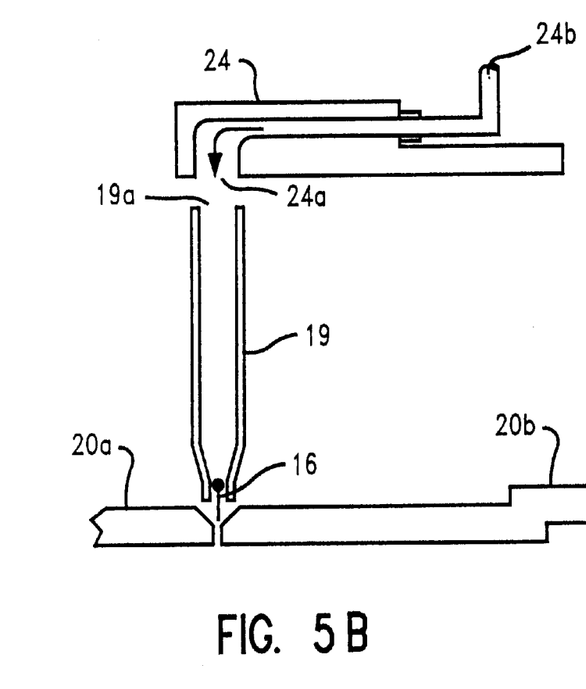

In FIG. 5B, the punch pin blow down device is shown in detail as having an inlet opening 24b and an outlet opening 24a. The blow down device opening 24a is positioned above the opening 19a of punch pin receiver device 19 and compressed air or other force applied at inlet opening 24b will force the punch pin 16 from the receiver device 19 into the jaw opening of jaws 20a and 20b as described above.

Figure 6A:
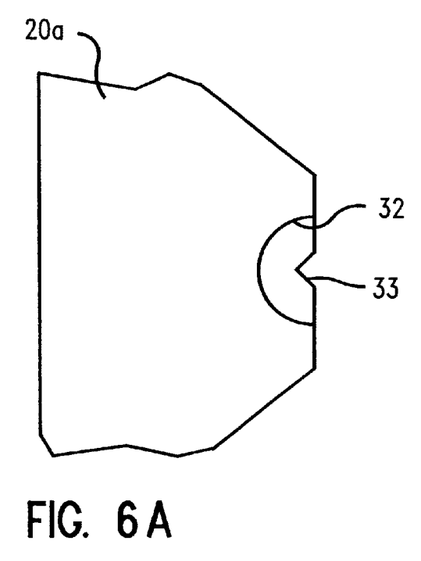
FIGS. 6A, 6B and 6C show a top view, end view and elevational view, respectively, of the left jaw used in the method and apparatus of the invention.
Figure 6B:
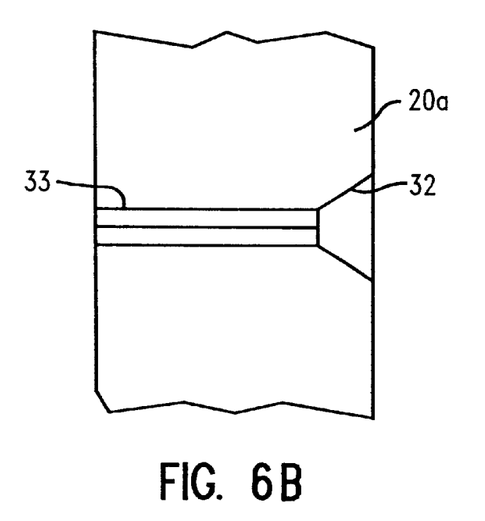
Figure 6C:
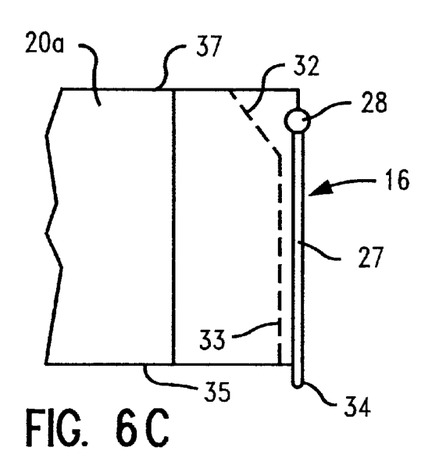

FIGS. 6A–6C show details of the left jaw 20a. The right jaw 20b would be similar but reversed. A round tapered opening 32 is shown having an intersecting triangular indent 33 extending through the thickness of left jaw 20a as seen in FIG. 6B. In FIG. 6C a punch pin 16 is shown positioned in the left jaw 20a and the punch pin head 28 is shown resting at the base of taper 32. The shank extends through the thickness of jaw 20a and the shank end 34 is shown slightly below the lower surface 35 of jaw 20a.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for loading punch pins into a gang-punch apparatus comprises:
    a punch pin supply plate containing a plurality of openings in a grid in which a plurality of punch pins are positioned vertically, the punch pins having an elongated shank of a first diameter and a second larger diameter head which head rests on or is slightly above the upper surface of the supply plate;
    a punch pin removal device for removing a punch pin from the supply plate into the punch pin removal device;
    a left jaw and a right jaw each movable horizontally and each having an upper surface and a lower surface and a mating opening at each end thereof for receiving and holding a punch pin vertically;
    a punch pin receiver device having an open upper end and an open lower end for receiving the removed punch pin from the punch pin removal device in a vertical orientation with the head upward, the lower end of the punch pin receiver device being positioned proximate the upper surface of the left jaw;
    a punch pin blow down device for exerting a force on the punch pin in the punch pin receiver device;
    a punch pin pusher device for exerting a force on the head of the punch pin; and
    an X-Y table on which a gang-punch pin holding plate having a plurality of openings is secured thereto for positioning the gang-punch punch pin holding plate;
    wherein a punch pin removed from the supply plate by the punch pin removal device is transferred to the punch pin receiver device, the left jaw and right jaw are mated and positioned over the gang-punch punch pin holding plate opening to be filled and the punch pin receiver moved over the opening and the punch pin blow down device forces the punch pin from the punch pin receiver into the opening in the jaws, the punch pin receiver and punch pin blow down devices are then moved away and the punch pin pusher device used to exert a force on the head of the punch pin forcing the punch pin partly into the gang-punch punch pin holding plate opening, the jaws are then moved away and the punch pin pusher device used to exert a force on the head of the punch pin forcing the punch pin into the gang-punch punch pin holding plate opening with the above steps being repeated until the desired number of punch pins are transferred from the punch pin supply plate to the gang-punch punch pin holding plate.

2. The apparatus of claim 1 further containing a transfer conduit for transferring the punch pin from the removal device to the punch pin receiver device.

3. The apparatus of claim 1 further containing a video verification device to determine if the punch pin was properly transferred to the opening in the punch pin holding plate.

4. The apparatus of claim 1 wherein the jaws have a round tapered opening and an intersecting triangular indent at the mating ends thereof.

5. A method for loading punch pins into a gang-punch apparatus comprises the steps of:
    supplying a gang-punch punch pin holding plate having a plurality of openings to be filled with punch pins, the punch pins having an elongated shank of a first diameter and a second larger diameter head which head is slightly above or supported by the upper surface of the holding plate;
    positioning the gang-punch punch pin holding plate into a gang-punch punch pin loading apparatus of claim 1;
    removing a punch pin from the punch pin supply plate with the punch pin removal device;
    transferring the punch pin into the punch pin receiver device;
    moving the left and right jaws over the opening in the gang-punch punch pin holding plate to be filled;
    moving the punch pin receiver device over the jaw opening;
    forcing the punch pin from the receiver device into the jaw opening using the punch pin blow down device;
    moving the punch pin receiver device and punch pin blow down device away from the opening in the gang-punch punch pin holding plate;
    forcing the punch pin partly into the gang-punch punch pin holding plate using the punch pin pusher device to exert a force on the head of the punch pin;
    moving the jaws away from the opening and forcing the punch pin into the gang-punch punch pin holding plate using the punch pin pusher device; and
    repeating the above steps until the desired number of punch pins are transferred from the punch pin supply plate to the gang-punch punch pin holding plate.

6. The method of claim 5 wherein the punch pin is transferred from the punch pin removal device to the punch pin receiver device using a conduit.

7. The method of claim 5 wherein proper positioning of the punch pin in the opening in the punch pin holding plate is determined using a video verification device.

8. The method of claim 5 wherein a vacuum is used to remove the punch pin from the punch pin supply plate to the punch pin removal device.

9. The method of claim 8 wherein compressed air is used to transfer the punch pin to the punch pin receiver device.

10. The method of claim 9 wherein compressed air is used to force the punch pin from the receiver device into the jaw opening.

* * * * *